US011106173B2

(12) United States Patent
Sekiya

(10) Patent No.: US 11,106,173 B2
(45) Date of Patent: Aug. 31, 2021

(54) IMAGE FORMING APPARATUS HAVING MOUNTING ARRANGEMENT OF FIRST AND SECOND CIRCUIT BOARDS

(71) Applicant: CANON KABUSHIKI KAISHA, Tokyo (JP)

(72) Inventor: Takeshi Sekiya, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/100,654

(22) Filed: Nov. 20, 2020

(65) Prior Publication Data

US 2021/0165358 A1 Jun. 3, 2021

(30) Foreign Application Priority Data

Nov. 29, 2019 (JP) .............................. JP2019-216295

(51) Int. Cl.
*G03G 15/00* (2006.01)
*H05K 1/00* (2006.01)
*G03G 21/16* (2006.01)
*H05K 1/14* (2006.01)

(52) U.S. Cl.
CPC ......... *G03G 15/80* (2013.01); *G03G 21/1652* (2013.01); *H05K 1/14* (2013.01)

(58) Field of Classification Search
CPC ...... G03G 15/80; G03G 21/1652; H05K 1/14; H05K 7/02
USPC ..................................................... 399/88, 90
See application file for complete search history.

(56) References Cited

U.S. PATENT DOCUMENTS

| 10,845,741 | B2* | 11/2020 | Fujiwara | G03G 15/80 |
|---|---|---|---|---|
| 10,908,550 | B2* | 2/2021 | Kanno | G03G 21/1619 |
| 10,915,065 | B2* | 2/2021 | Hata | G03G 15/80 |
| 2001/0017766 | A1* | 8/2001 | Murowaki | H05K 1/148 |
| | | | | 361/752 |
| 2004/0131378 | A1* | 7/2004 | Hattori | G03G 15/80 |
| | | | | 399/90 |
| 2020/0225601 | A1* | 7/2020 | Sato | H04N 1/32 |
| 2020/0283250 | A1* | 9/2020 | Sako | G03G 15/6529 |
| 2020/0285189 | A1* | 9/2020 | Teramoto | G03G 15/80 |
| 2020/0409301 | A1* | 12/2020 | Kuroki | H01R 12/91 |

FOREIGN PATENT DOCUMENTS

| JP | 03002878 A | * | 1/1991 | |
|---|---|---|---|---|
| JP | 2014044448 A | | 3/2014 | |
| JP | 2017227729 A | * | 12/2017 | ......... G03G 21/1652 |
| KR | 2006057835 A | * | 5/2006 | |

* cited by examiner

*Primary Examiner* — Robert B Beatty
(74) *Attorney, Agent, or Firm* — Canon U.S.A., Inc. I.P. Division

(57) ABSTRACT

An image forming apparatus includes a harness of which one end is connected to an electrical component. Another end of the harness is connected to a second side of a first circuit board with the harness being bent at a bending point when the first circuit board is mounted to a first mounting area, and is connected to a second side of a second circuit board without the harness being bent at the bending point when the second circuit board is mounted to a second mounting area. A first side of the first circuit board and a first side of the second circuit board are positioned at the same position when mounted. A distance between the second side of the first circuit board and the second side of the second circuit board is smaller than a distance between the bending point and the second side of the first circuit board.

5 Claims, 5 Drawing Sheets

IMAGE FORMING APPARATUS HAVING MOUNTING ARRANGEMENT OF FIRST AND SECOND CIRCUIT BOARDS

BACKGROUND OF THE DISCLOSURE

Field of the Disclosure

The present disclosure relates to an image forming apparatus including a common harness connectable to different electric circuit boards.

Description of the Related Art

In recent years, with colorization and an increase in speed of image forming apparatus, the number of electric circuit boards configured to electrically control an image forming apparatus is increased, and the number of harnesses configured to connect the electric circuit boards to other electrical components is also increased. Meanwhile, with downsizing of image forming apparatus, it is required to reduce the number of electrical components and the number of harnesses in an image forming apparatus, and to optimize wiring paths and hence reduce lengths of the harnesses. As one solution for the requirements, it is proposed to devise arrangement of an electric circuit board to reduce a length of a harness (Japanese Patent Application Laid-Open No. 2014-44448).

The image forming apparatus may have a plurality of configurations having different functions in the same housing, and in order to achieve each of the configurations, use electric circuit boards having different sizes for the respective configurations. The electric circuit boards of the image forming apparatus may include user interfaces, such as USB connectors and LAN connectors, which a user accesses directly. In that case, considering usability for the user, it is preferred that connectors of the user interfaces be arranged at the same position even for different configurations.

However, when the connectors of the user interfaces are to be arranged at the same position, other connectors of the electric circuit boards may be arranged at different positions because the electric circuit boards have different sizes. As a result, lengths of the harnesses that are required for connection can change depending on the sizes of the electric circuit boards and it can be difficult to use a common harness.

SUMMARY OF THE DISCLOSURE

In view of the above, an aspect of the present disclosure provides an image forming apparatus, on which electric circuit boards having different sizes are mountable, and in which a common harness can be used.

According to an embodiment of the present disclosure, there is provided an image forming apparatus configured to form an image on a recording medium, the image forming apparatus comprising: a housing; a first mounting area which is provided in the housing, and to which a first electric circuit board configured to control the image forming apparatus in a first configuration is to be mounted; a second mounting area which is provided in the housing, and to which a second electric circuit board configured to control the image forming apparatus in a second configuration is to be mounted; an electrical component; and a harness of which one end portion is connected to the electrical component and another end portion of the harness being connected to one of the first electric circuit board with the harness being bent at a bending point when the first electric circuit board is mounted to the first mounting area, and to the second electric circuit board without the harness being bent at the bending point when the second electric circuit board is mounted to the second mounting area, wherein the first electric circuit board has a size that is different from a size of the second electric circuit board, wherein the first mounting area and the second mounting area have a common section, wherein the first electric circuit board mounted to the first mounting area has a first side at the same position as a position of a first side of the second electric circuit board mounted to the second mounting area, and wherein a distance between a position of a second side, to which the another end portion of the harness is to be connected, of the first electric circuit board and a position of a second side, to which the another end portion of the harness is to be connected, of the second electric circuit board is smaller than a distance between a position of the bending point of the harness and the position of the second side of the first electric circuit board.

Further features of the present disclosure will become apparent from the following description of exemplary embodiments with reference to the attached drawings.

DESCRIPTION OF THE EMBODIMENTS

Now, embodiments of the present disclosure are described with reference to the accompanying drawings.

First Embodiment (Image Forming Apparatus)

Figure 1:
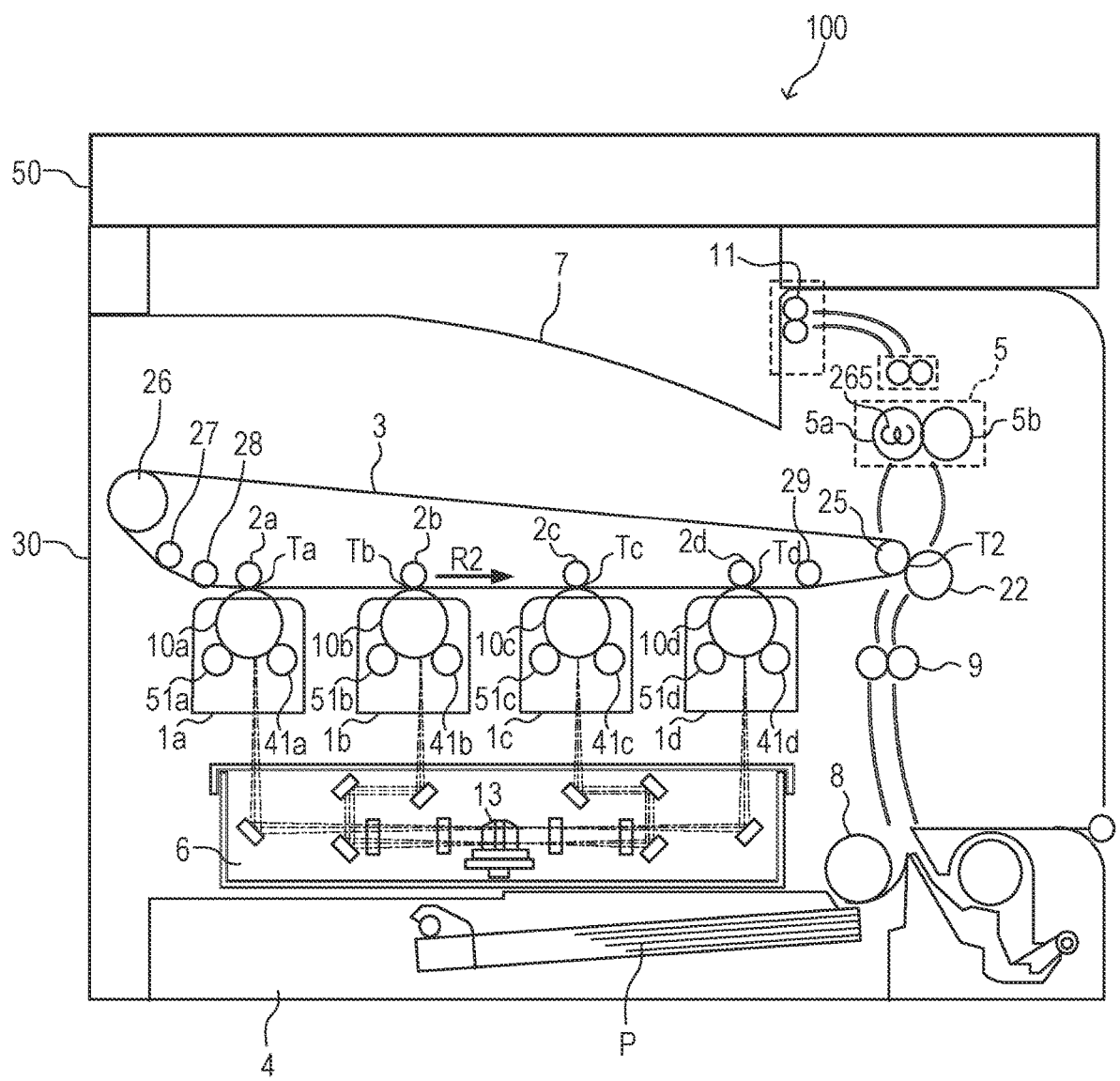
FIG. 1 is a cross-sectional view of an image forming apparatus.

FIG. 1 is a cross-sectional view of an image forming apparatus 100. As illustrated in FIG. 1, the image forming apparatus 100 is a full-color printer employing a tandem-type intermediate transfer system, in which image forming stations 1a, 1b, 1c, and 1d are arrayed along a downward surface of an intermediate transfer belt 3. A separation roller 8 is configured to separate recording materials P drawn out from a recording material cassette 4 one by one and convey each of the separated recording materials P to registration rollers 9. The registration rollers 9 are configured to receive the recording material P and cause the recording material P to stand by in a stopped state, and to convey the recording material P to a secondary transfer portion T2 at a timing synchronized with a toner image on the intermediate transfer belt 3.

The image forming stations 1a, 1b, 1c, and 1d have substantially the same configuration except that developing devices 51a, 51b, 51c, and 51d thereof use toners of different colors: yellow, magenta, cyan, and black. The image forming station 1a is described below. The other image forming stations 1b, 1c, and 1d are assumed to be described by replacing the letter "a" suffixed to each reference numeral in the description by "b," "c," and "d." The suffixes "a," "b," c," and "d" on each reference numeral indicate yellow, magenta, cyan, and black, respectively, but the suffixes "a," "b," "c," and "d" on each reference numeral are omitted except when particularly required.

A photosensitive drum 10 has a photosensitive layer having a negative charge polarity formed on an outer peripheral surface thereof. The surface of the photosensitive drum 10 is charged to a uniform potential having a negative polarity by a charging roller 41. An exposure device 6 is configured to scan a laser beam modulated in accordance with image data by a rotary polygon mirror 13 to form an electrostatic image on the uniformly charged surface of the photosensitive drum 10. The electrostatic image formed on the surface of the photosensitive drum 10 has a toner attached thereto by the developing device 51 included in the image forming station 1 to be reversely developed as a toner image. When a DC voltage having a positive polarity is applied to a primary transfer roller 2, the toner image having the negative polarity, which is born on the photosensitive drum 10, is primarily transferred to the intermediate transfer belt 3 passing through a primary transfer portion T.

The intermediate transfer belt 3 is supported by being stretched around a tension roller 27, a belt driving roller 26, a secondary transfer inner roller 25, and primary transfer tension rollers 28 and 29. The intermediate transfer belt 3 is rotated by the belt driving roller 26 in a direction indicated by an arrow R2. A secondary transfer roller 22 is configured to abut against the secondary transfer inner roller 25 via the intermediate transfer belt 3 to form the secondary transfer portion T2 between the secondary transfer roller 22 and the intermediate transfer belt 3. When a DC voltage having a positive polarity is applied to the secondary transfer roller 22, a transfer electric field of the toner image is formed between the secondary transfer roller 22 and the secondary transfer inner roller 25, which is connected to a ground potential.

A fixing device 5 includes a fixing roller 5a, which includes a fixing heater 265, and a pressure roller 5b. The pressure roller 5b is brought into pressure contact with the fixing roller 5a to form a heating nip. The recording material P is sandwiched by the heating nip to be heated and pressurized while being conveyed so that the toner image is melted to be fixed on a surface of the recording material P. As a result, a full-color image is formed on the surface of the recording material P. The recording material P having the image formed thereon is delivered to a delivery tray 7 by delivery rollers 11.

(Image Reading Apparatus)

The image forming apparatus 100 has a document scanner (hereinafter referred to as "image reading apparatus") 50 provided above a housing 30 thereof. The image reading apparatus 50 is configured to scan an original placed on the image reading apparatus 50 to read an image of the original. The image reading apparatus 50 is configured to transmit the read image as image data to the image forming apparatus 100. The image forming apparatus 100 is configured to form an image on a recording material P in accordance with the image data received from the image reading apparatus 50. The image forming apparatus 100 can also receive image data from external equipment, and form an image on a recording material P in accordance with the received image data.

(Control Unit)

Figure 2:
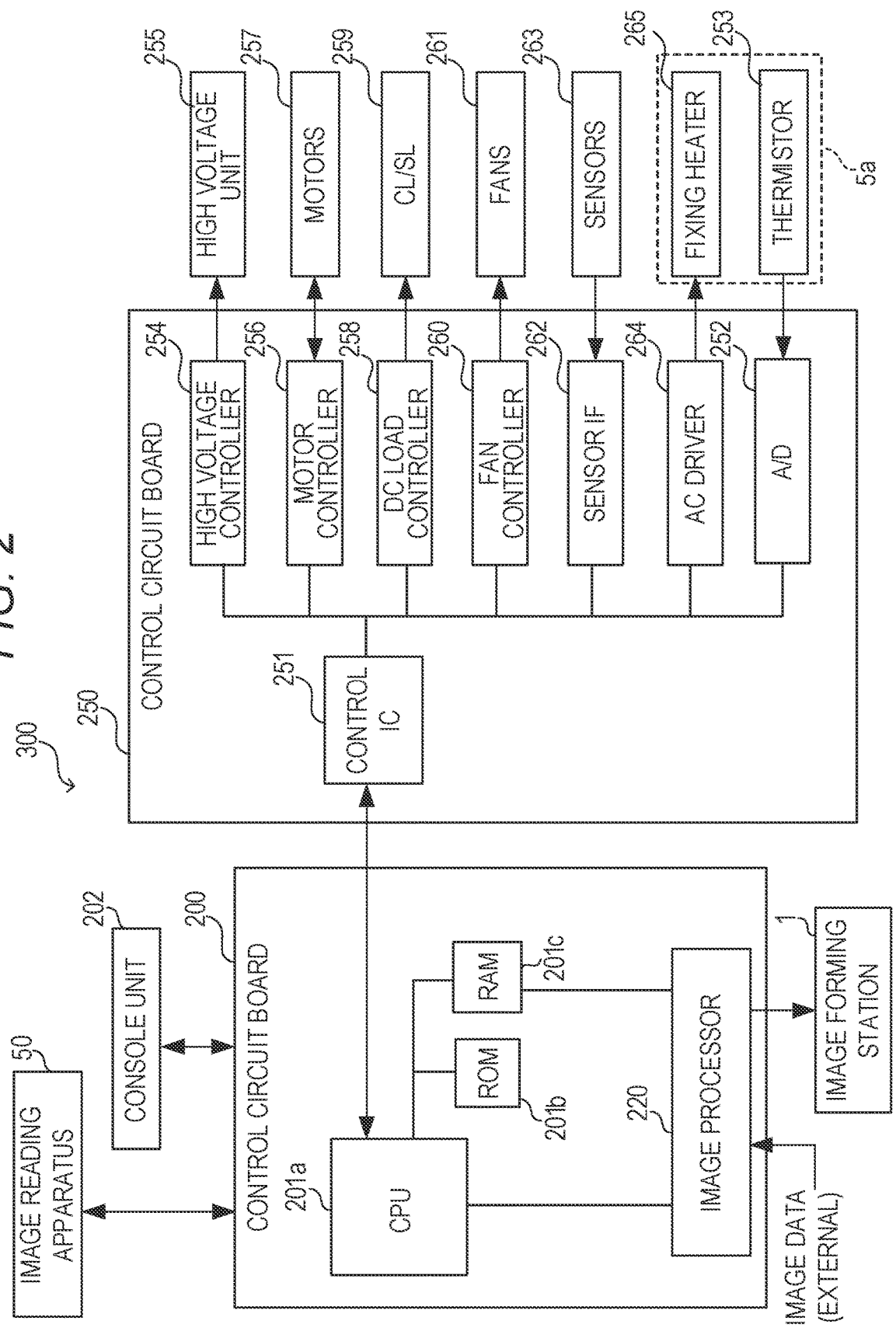
FIG. 2 is a block diagram of a control unit of the image forming apparatus.

FIG. 2 is a block diagram of a control unit 300 of the image forming apparatus 100. The control unit 300 includes a console unit 202, and controller circuit boards (hereinafter referred to as "control circuit boards") 200 and 250. The control circuit board 200 includes a CPU 201a, a ROM 201b, a RAM 201c, and an image processor 220. The control circuit board 200 is configured to control the whole image forming apparatus 100. The control circuit board 200 is also configured to perform control on communication to/from the image reading apparatus 50, image processing by the image processor 220, and display on the console unit 202.

The CPU 201a is configured to execute an image forming sequence in accordance with a program stored in the ROM 201b. The RAM 201c is configured to store rewritable data during the execution of the image forming sequence. The RAM 201c is supplied with electric power by a battery (not shown), and can hold data even when the image forming apparatus 100 is powered off. The image processor 220 is configured to perform the image processing on externally input image data, and transmit the image data to the image forming station 1. The image processor 220 is configured to perform the image processing also on the image data of the original obtained as a result of reading by the image reading apparatus 50.

The control circuit board 250 includes a control integrated circuit (hereinafter referred to as "control IC") 251, a high voltage controller 254, a motor controller 256, a DC load controller 258, and a fan controller 260. The control circuit board 250 further includes a sensor interface (hereinafter referred to as "sensor IF") 262, an AC driver 264, and an analog-to-digital converter (hereinafter referred to as "A/D") 252. The control IC 251 is electrically connected to the high voltage controller 254, the motor controller 256, the DC load controller 258, the fan controller 260, the sensor IF 262, the AC driver 264, and the A/D 252. The control IC 251 is electrically connected to the CPU 201a of the control circuit board 200.

The control IC 251 is configured to drive motors 257 through the motor controller 256, drive a clutch/solenoid (hereinafter referred to as "CL/SL") 259 through the DC load controller 258, and drive fans 261 through the fan controller 260. The control IC 251 is configured to collect and analyze information of sensors 263 through the sensor IF 262. The AC driver 264 is configured to control the fixing heater 265 included in the fixing roller 5a to be turned ON/OFF. The fixing roller 5a includes a thermistor 253. Temperature data (value) detected by the thermistor 253 along with a change in temperature of the fixing roller 5a is input to the control IC 251 via the A/D 252. The control IC 251 is configured to control the AC driver 264 based on the temperature data. The high voltage controller 254 is configured to output various high voltage control signals to a high voltage unit 255 based on a signal from the control IC 251. The high voltage unit 255 is configured to apply appropriate high voltages to the charging roller (primary charger) 41, the primary transfer roller (transfer charger) 2, the secondary transfer roller (transfer charger) 22, and a developing roller included in the developing device 51.

(Control Circuit Boards and Power Supply Harness)

Figure 3A:
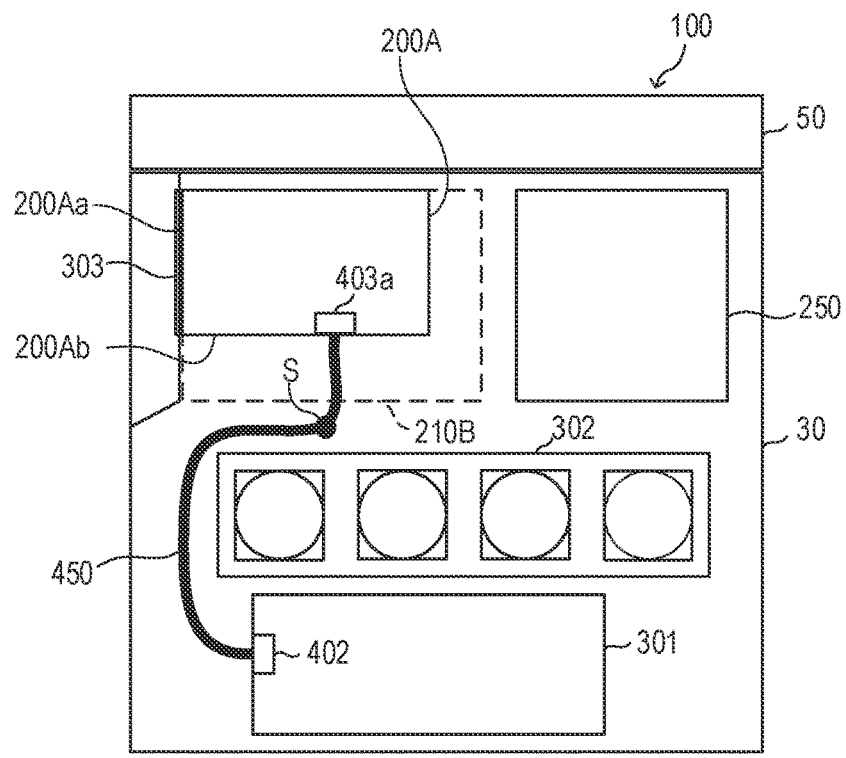
FIG. 3A and FIG. 3B are each a block diagram for illustrating the structure on a back side of the image forming apparatus.
Figure 3B:
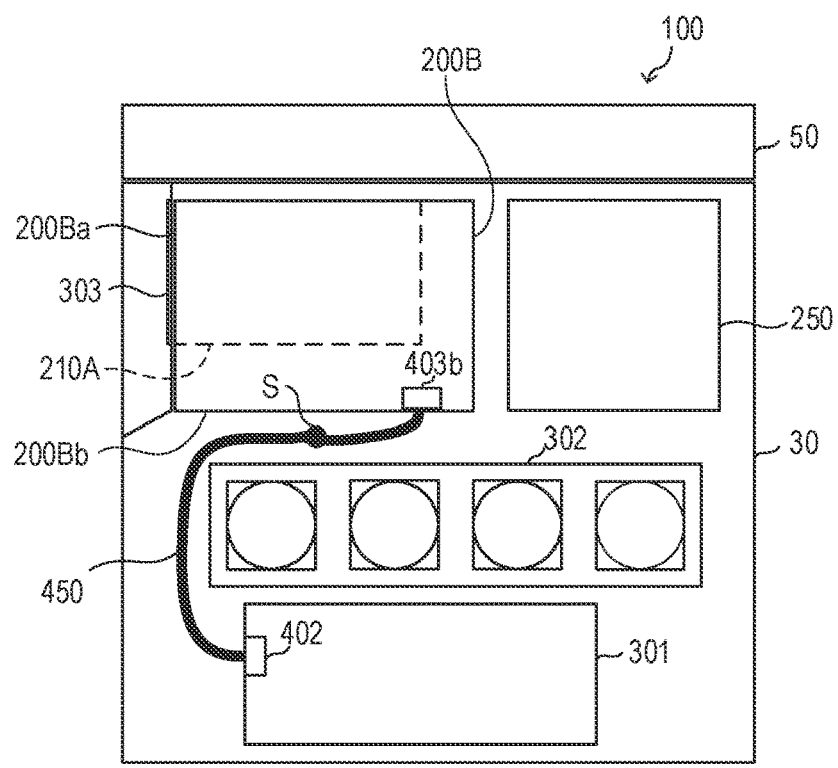

FIG. 3A and FIG. 3B are each a block diagram for illustrating the structure on a back side of the image forming apparatus 100. On the housing 30 of the image forming apparatus 100, any one of a first control circuit board (first electric circuit board) 200A and a second control circuit board (second electric circuit board) 200B, which have different sizes, is mountable. It is not that both of the first control circuit board 200A and the second control circuit board 200B are mountable on the housing 30 of the image forming apparatus 100 at the same time, but one of the first control circuit board 200A and the second control circuit board 200B is mounted on the housing 30 of the image forming apparatus 100. The first control circuit board 200A is mounted to a first mounting portion (first mounting area) 210A illustrated in FIG. 3B. The second control circuit board 200B is mounted to a second mounting portion (second mounting area) 210B illustrated in FIG. 3A. The first mounting portion 210A and the second mounting portion 210B have a common section. In the first embodiment, the first mounting portion 210A is included in an area of the second mounting portion 210B. FIG. 3A is a diagram for illustrating the image forming apparatus 100 in which the first control circuit board 200A is mounted to the first mounting portion 210A. FIG. 3B is a diagram for illustrating the image forming apparatus 100 in which the second control circuit board 200B is mounted to the second mounting portion 210B.

The first control circuit board 200A and the second control circuit board 200B can be used selectively depending on a function of the image forming apparatus 100. The first control circuit board 200A is mounted on the image forming apparatus 100 having a first configuration as a standard configuration. The second control circuit board 200B has implemented therein a circuit capable of achieving a printing resolution with high accuracy. Further, the second control circuit board 200B has a size that is larger than that of the first control circuit board 200A. The second control circuit board 200B is mounted on the image forming apparatus 100 having a second configuration as a high resolution configuration. In other words, the image forming apparatus 100 having the second control circuit board 200B mounted thereon can form an image at a resolution that is higher than that obtained by the image forming apparatus 100 having the first control circuit board 200A mounted thereon. The first configuration as the standard configuration and the second configuration as the high resolution configuration are merely exemplary, and the first embodiment is not limited thereto. For example, the image forming apparatus 100 having the second control circuit board 200B mounted thereon is larger in maximum number of images formed per unit time than the image forming apparatus 100 having the first control circuit board 200A mounted thereon. Further, for example, the image forming apparatus 100 having the second control circuit board 200B mounted thereon may be a color printer, and the image forming apparatus 100 having the first control circuit board 200A mounted thereon may be a monochrome printer.

A power source unit (electrical component) 301 is configured to supply a power source voltage to the first control circuit board 200A or the second control circuit board 200B and to the control circuit board 250. A drive unit 302 is configured to drive the image forming stations 1a, 1b, 1c, and 1d. The first control circuit board 200A mounted to the first mounting portion 210A has at least one side (first side) 200Aa at the same position as that of at least one side (first side) 200Ba of the second control circuit board 200B mounted to the second mounting portion 210B. The first side 200Aa of the first control circuit board 200A at the same position as that of the first side 200Ba of the second control circuit board 200B includes an interface 303. Similarly, the first side 200Ba of the second control circuit board 200B at the same position as that of the first side 200Aa of the first control circuit board 200A includes an interface 303.

In the interface 303, a LAN connector (not shown) and a USB connector (not shown) implemented on the first control circuit board 200A or the second control circuit board 200B are arrayed. A user can connect a LAN cable (not shown) and a USB cable (not shown) to the LAN connector (not shown) and the USB connector (not shown), which are arrayed in the interface 303, respectively. The LAN cable (not shown) and the USB cable (not shown) are connected to external equipment or peripheral equipment. In consideration of usability for the user, the interface 303 is arranged at the same position irrespective of the first control circuit board 200A or the second control circuit board 200B. As a result, because the first control circuit board 200A and the second control circuit board 200B have different sizes, another side (second side) 200Ab of the first control circuit board 200A is not at the same position as that of another side (second side) 200Bb of the second control circuit board 200B.

As illustrated in FIG. 3A, when the first control circuit board 200A is mounted on the image forming apparatus 100, a power supply harness 450 connects the power source unit 301 and the first control circuit board 200A to supply electric power from the power source unit 301 to the first control circuit board 200A. The power supply harness 450 is a wire harness as an electric wire bundle formed of a plurality of electric wires. The power supply harness 450 is bent with a branch point (bending point) S on a wiring path being a base point. The power supply harness 450 has one end portion connected to a connector 402 of the power source unit 301, and has another end portion connected to a first connector 403a included in the second side 200Ab of the first control circuit board 200A. The power supply harness 450 may or may not be fixed at the branch point S. It is only required that the power supply harness 450 be held to be bendable at or in the vicinity of the branch point S.

As illustrated in FIG. 3B, when the second control circuit board 200B is mounted on the image forming apparatus 100, the power supply harness 450 connects the power source unit 301 and the second control circuit board 200B to supply electric power from the power source unit 301 to the second control circuit board 200B. The power supply harness 450 is wired without being bent at the branch point S on a wiring path. The power supply harness 450 has one end portion connected to the connector 402 of the power source unit 301, and has another end portion connected to a second connector 403b included in the second side 200Bb of the second control circuit board 200B. The second connector 403b is arranged on the second control circuit board 200B in accordance with a wiring length of the power supply harness 450. Therefore, it is possible to use the same power supply harness 450 as that used when the first control circuit board 200A is mounted to the image forming apparatus 100 as illustrated in FIG. 3A.

Figure 4:
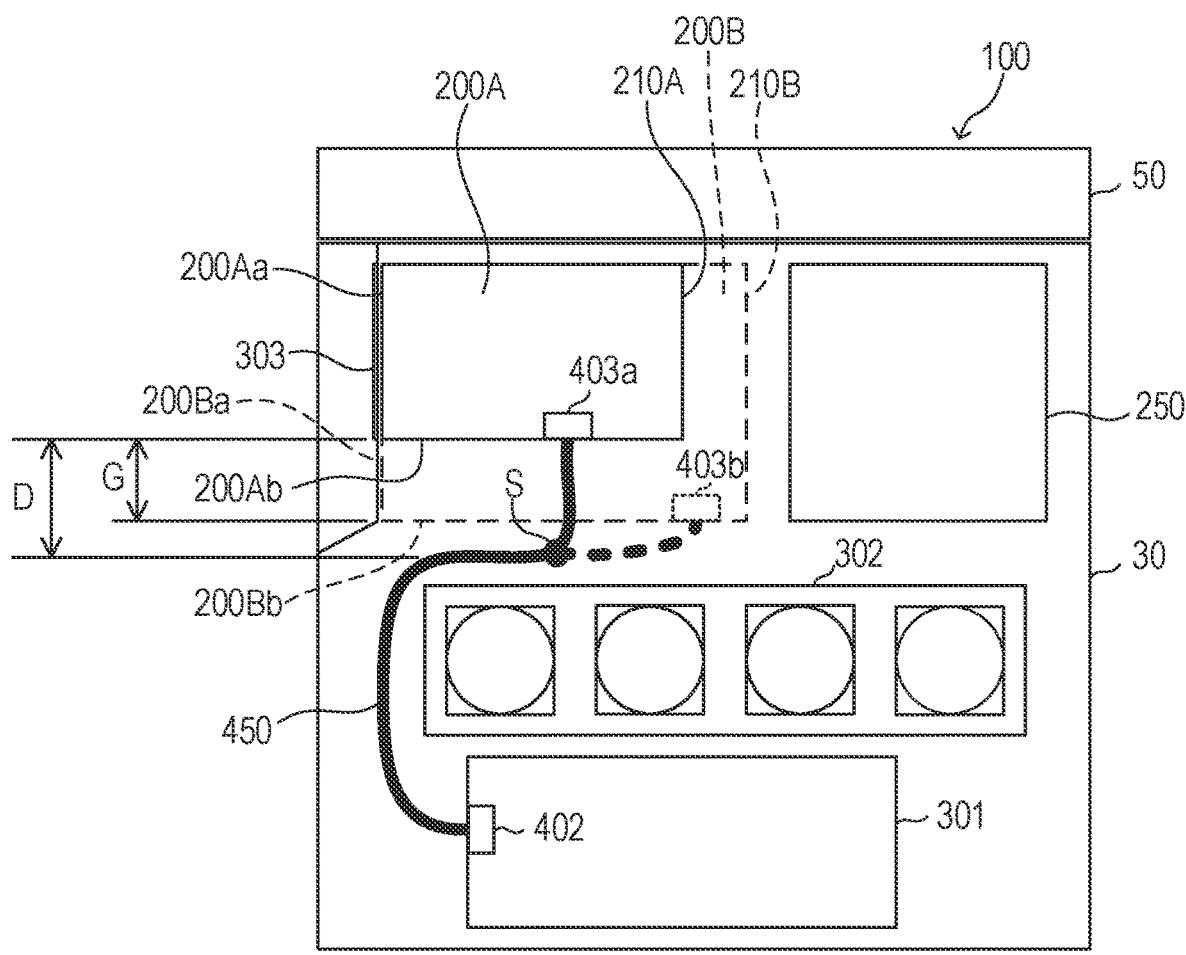
FIG. 4 is a diagram for illustrating a positional relationship between a lower end portion of a first control circuit board and a lower end portion of a second control circuit board in a first embodiment.

FIG. 4 is a diagram for illustrating a positional relationship between a lower end portion of the first control circuit board 200A and a lower end portion of the second control circuit board 200B in the first embodiment. A distance G between a position of the second side 200Ab at the lower end portion of the first control circuit board 200A and a position of the second side 200Bb at the lower end portion of the second control circuit board 200B is smaller than a distance D between the position of the second side 200Ab of the first control circuit board 200A and a position of the branch point S (G<D). The branch point S on the wiring path of the power supply harness 450 is arranged so as to satisfy the relationship that the distance G is smaller than the distance D. With this configuration, in the image forming apparatus 100 on which one of the plurality of control circuit boards (first control circuit board 200A and second control circuit board 200B) having different sizes is exclusively mountable, even when the control circuit board has a limitation in its arrangement, the power supply harness 450 can have the same dimension. According to the first embodiment, in the image forming apparatus 100 capable of achieving a plurality of configurations, the common power supply harness 450 can be used. With the reduced number of types of the harnesses, a management cost in a production department can be reduced.

According to the first embodiment, in the image forming apparatus 100 on which the control circuit boards (electric circuit boards) having different sizes are mountable, a common harness (wire harness) can be used.

In the first embodiment, there has been described the case in which there is the limitation that the interfaces 303 are arranged at the common position. However, the first embodiment is also applicable to a case in which there is another limitation that other portions of the first control circuit board 200A and the second control circuit board 200B are arranged at the common position.

Second Embodiment

Now, description is made of a second embodiment. In the second embodiment, structures similar to those in the first embodiment are denoted by the same reference symbols, and description thereof is omitted. An image forming apparatus 100, an image reading apparatus 50, and a control unit 300 in the second embodiment are similar to those in the first embodiment, and hence description thereof is omitted. A first mounting portion (first mounting area) 610A of a first control circuit board 600A and a second mounting portion (second mounting area) 610B of a second control circuit board 600B in the second embodiment are different from the first embodiment. Differences from the first embodiment are mainly described below.

(Control Circuit Board and Power Supply Harness)

Figure 5:
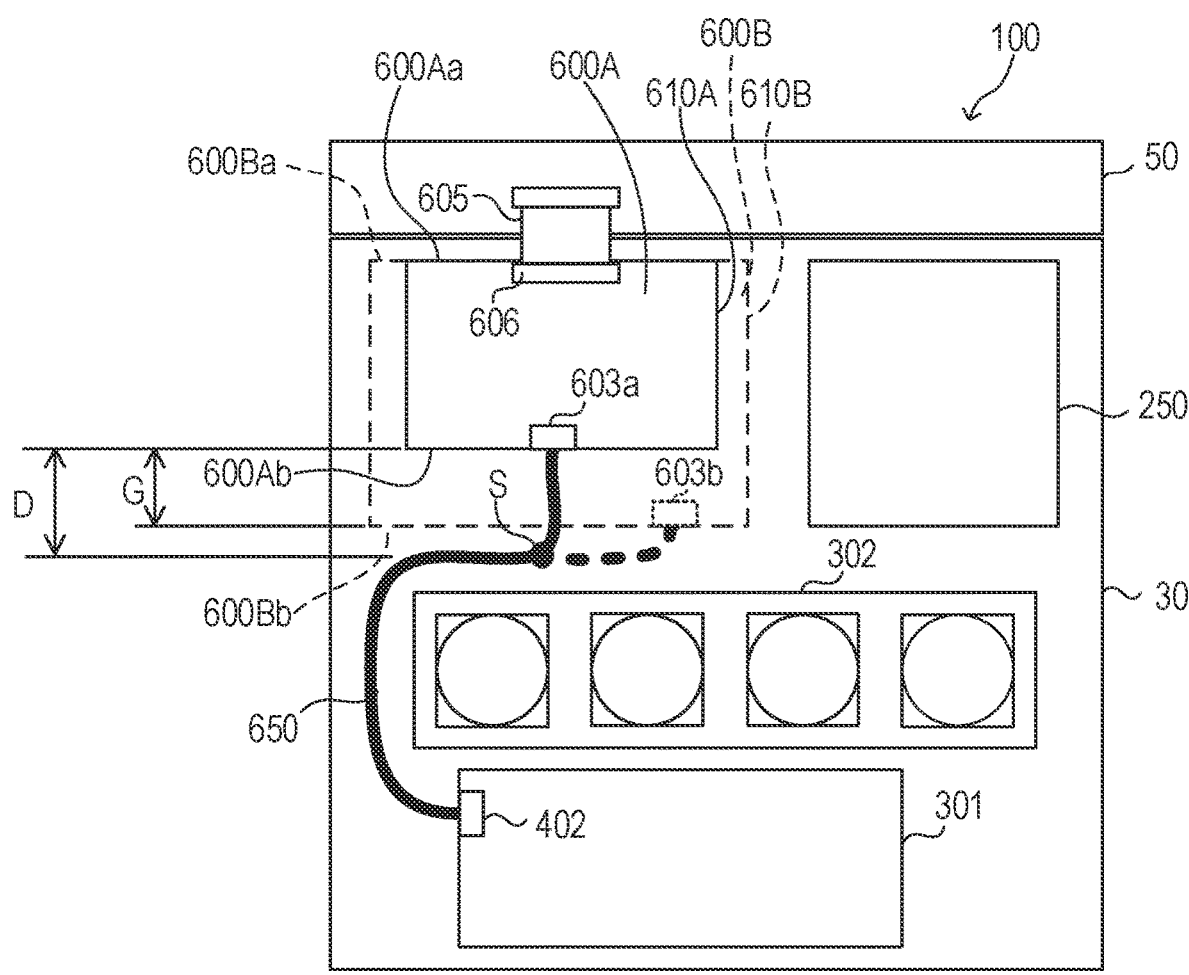
FIG. 5 is a diagram for illustrating a positional relationship between a lower end portion of a first control circuit board and a lower end portion of a second control circuit board in a second embodiment.

FIG. 5 is a diagram for illustrating a positional relationship between a lower end portion of the first control circuit board 600A and a lower end portion of the second control circuit board 600B in the second embodiment. One of the first control circuit board 600A and the second control circuit board 600B having different sizes can be mounted on the housing 30 of the image forming apparatus 100. The first control circuit board 600A and the second control circuit board 600B can be used selectively depending on a function. In the second embodiment, the second control circuit board 600B is larger than the first control circuit board 600A. The first control circuit board 600A is mounted to the first mounting portion (first mounting area) 610A. The second control circuit board 600B is mounted to the second mounting portion (second mounting area) 610B. The first mounting portion 610A and the second mounting portion 610B have a common section. In the second embodiment, the first mounting portion 610A is included in an area of the second mounting portion 610B.

The first control circuit board 600A mounted to the first mounting portion 610A has at least one side (first side) 600Aa at the same position as that of at least one side (first side) 600Ba of the second control circuit board 600B mounted to the second mounting portion 610B. The first side 600Aa of the first control circuit board 600A at the same position as that of the first side 600Ba of the second control circuit board 600B includes a connector 606. Similarly, the first side 600Ba of the second control circuit board 600B at the same position as that of the first side 600Aa of the first control circuit board 600A includes a connector 606.

When the first control circuit board 600A is mounted on the image forming apparatus 100, a power supply harness 650 connects the power source unit 301 and the first control circuit board 600A to supply electric power from the power source unit 301 to the first control circuit board 600A. The power supply harness 650 is bent with a branch point (bending point) S on a wiring path being a base point. The power supply harness 650 has one end portion connected to the connector 402 of the power source unit 301, and has another end portion connected to a first connector 603a included in another side (second side) 600Ab of the first control circuit board 600A.

When the second control circuit board 600B is mounted on the image forming apparatus 100, the power supply harness 650 connects the power source unit 301 and the second control circuit board 600B to supply electric power from the power source unit 301 to the second control circuit board 600B. The power supply harness 650 is wired without being bent at the branch point S on the wiring path. The power supply harness 650 has the one end portion connected to the connector 402 of the power source unit 301, and has the another end portion connected to a second connector 603b included in another side (second side) 600Bb of the second control circuit board 600B. The second connector 603b is arranged on the second control circuit board 600B in accordance with a wiring length of the power supply harness 650. Therefore, it is possible to use the same power supply harness 650 as that used when the first control circuit board 600A is mounted on the image forming apparatus 100.

A flat cable 605 has one end portion connected to the image reading apparatus 50 as external equipment or peripheral equipment. When the first control circuit board 600A is mounted on the housing 30 of the image forming apparatus 100, the flat cable 605 connects the image reading apparatus 50 and the first control circuit board 600A to transmit signals between the image reading apparatus 50 and the first control circuit board 600A. The flat cable 605 has another end portion connected to the first control circuit board 600A via the connector 606. When the second control circuit board 600B is mounted on the housing 30 of the image forming apparatus 100, the flat cable 605 connects the image reading apparatus 50 and the second control circuit board 600B to transmit signals between the image reading apparatus 50 and the second control circuit board 600B. The flat cable 605 has the another end portion connected to the second control circuit board 600B via the connector 606. In this example, irrespective of whether the first control circuit board 600A or the second control circuit board 600B is mounted on the housing 30 of the image forming apparatus 100, the flat cable 605 is arranged so as to have a common connection position (common position of the connector 606).

A distance G between a position of the second side 600Ab at a lower end portion of the first control circuit board 600A and a position of the second side 600Bb at a lower end portion of the second control circuit board 600B is smaller than a distance D between the position of the second side 600Ab of the first control circuit board 600A and the position of the branch point S (G<D). The branch point S on the wiring path of the power supply harness 650 is arranged so as to satisfy the relationship that the distance G is smaller than the distance D. With this configuration, in the image forming apparatus 100 on which one of the plurality of control circuit boards (first control circuit board 600A and second control circuit board 600B) having different sizes is exclusively mountable, even when the control circuit board has a limitation in its arrangement, the power supply harness 650 can have the same dimension. According to the second embodiment, in the image forming apparatus 100 capable of achieving the plurality of configurations, the common power supply harness 650 can be used. As a result, when the control circuit board is replaced so as to change the function of the image forming apparatus 100, the same power supply harness 650 can be used. According to the second embodiment, in the image forming apparatus 100 capable of achieving a plurality of configurations, the common power supply harness 650 can be used. With the reduced number of types of the harnesses, a management cost in a production department can be reduced.

According to the second embodiment, in the image forming apparatus 100 on which the control circuit boards (electric circuit boards) having different sizes are mountable, a common harness (wire harness) can be used.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority form Japanese Patent Application No. 2019-216295, filed Nov. 29, 2019, which is hereby incorporated by reference herein in its entirety.

What is claimed is:

1. An image forming apparatus configured to form an image on a recording medium, the image forming apparatus comprising:
    a housing;
    a first mounting area which is provided in the housing, and to which a first electric circuit board configured to control the image forming apparatus in a first configuration is to be mounted;
    a second mounting area which is provided in the housing, and to which a second electric circuit board configured to control the image forming apparatus in a second configuration is to be mounted;
    an electrical component; and
    a harness of which one end portion is connected to the electrical component, and another end portion of the harness being connected to one of the first electric circuit board with the harness being bent at a bending point when the first electric circuit board is mounted to the first mounting area, and the second electric circuit board without the harness being bent at the bending point when the second electric circuit board is mounted to the second mounting area,
    wherein the first electric circuit board has a size that is different from a size of the second electric circuit board,
    wherein the first mounting area and the second mounting area have a common section,
    wherein the first electric circuit board mounted to the first mounting area has a first side at a same position as a position of a first side of the second electric circuit board mounted to the second mounting area, and
    wherein a distance between a position of a second side, to which the another end portion of the harness is to be connected, of the first electric circuit board and a position of a second side, to which the another end portion of the harness is to be connected, of the second electric circuit board is smaller than a distance between a position of the bending point of the harness and the position of the second side of the first electric circuit board.

2. The image forming apparatus according to claim 1, wherein the first side of the first electric circuit board includes an interface, and
    wherein the first side of the second electric circuit board includes an interface.

3. The image forming apparatus according to claim 1, wherein the first side of the first electric circuit board includes a connector to be connected to a peripheral equipment, and
    wherein the first side of the second electric circuit board includes a connector to be connected to the peripheral equipment.

4. The image forming apparatus according to claim 3, wherein the peripheral equipment is an image reading apparatus configured to read an image of an original.

5. The image forming apparatus according to claim 1, wherein the electrical component is a power source unit.

* * * * *